(12) United States Patent
Takeuchi et al.

(10) Patent No.: US 6,888,424 B2
(45) Date of Patent: May 3, 2005

(54) PIEZOELECTRIC RESONATOR, FILTER, AND ELECTRONIC COMMUNICATION DEVICE

(75) Inventors: Masaki Takeuchi, Otsu (JP); Hajime Yamada, Otsu (JP); Yoshihiko Goto, Shiga-ken (JP); Tadashi Nomura, Kyoto (JP); Yukio Yoshino, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/785,284

(22) Filed: Feb. 24, 2004

(65) Prior Publication Data

US 2004/0164648 A1 Aug. 26, 2004

Related U.S. Application Data

(62) Division of application No. 10/179,972, filed on Jun. 26, 2002, now abandoned.

(30) Foreign Application Priority Data

Jul. 3, 2001  (JP) .................................... 2001-202135
May 15, 2002 (JP) .................................... 2002-139863

(51) Int. Cl.[7] ............................................... H03H 9/00
(52) U.S. Cl. .................................... 333/187; 310/320
(58) Field of Search .......................... 333/187; 310/320, 310/312, 328, 366, 313 R, 365; 29/25.35; 374/117

(56) References Cited

U.S. PATENT DOCUMENTS

| | | | | |
|---|---|---|---|---|
| 4,445,256 A | * | 5/1984 | Huguenin et al. | .......... 29/25.35 |
| 5,032,755 A | * | 7/1991 | Witte | ......................... 310/312 |
| 5,149,197 A | * | 9/1992 | Rokos et al. | ................ 374/117 |
| 5,414,917 A | * | 5/1995 | Tanaka | ........................ 29/25.35 |
| 5,520,785 A | * | 5/1996 | Evans et al. | ........... 204/192.27 |
| 5,936,150 A | * | 8/1999 | Kobrin et al. | .............. 73/24.06 |
| 6,091,180 A | * | 7/2000 | Unami et al. | ............... 310/328 |
| 6,111,343 A | * | 8/2000 | Unami et al. | ................ 310/366 |
| 6,133,673 A | * | 10/2000 | Kawara et al. | ............. 310/320 |
| 6,339,276 B1 | * | 1/2002 | Barber et al. | ................ 310/312 |
| 6,437,482 B1 | | 8/2002 | Shibata | |
| 6,515,401 B1 | | 2/2003 | Ando et al. | |
| 6,601,276 B2 | * | 8/2003 | Barber | ........................ 29/25.35 |
| 6,700,302 B1 | * | 3/2004 | Yamamoto et al. | .......... 310/320 |

FOREIGN PATENT DOCUMENTS

| | | |
|---|---|---|
| EP | 0 669 713 A1 | 8/1995 |
| EP | 0 963 040 A2 | 12/1999 |
| GB | 2379108  * | 6/2002 |
| JP | 1-48694 | 10/1989 |
| JP | 2001-203558 | 7/2001 |
| JP | 2001-211053 | 8/2001 |
| JP | 2002-9579 | 1/2002 |

* cited by examiner

Primary Examiner—Patrick Wambley
(74) Attorney, Agent, or Firm—Keating & Bennett LLP

(57) ABSTRACT

A piezoelectric resonator includes a substrate, a vibration unit disposed on the substrate and having a structure in which at least one pair of an upper electrode and a lower electrode opposed to each other, the upper and lower electrodes sandwiching the upper and lower surfaces of an internal thin-film portion including at least one layer of a piezoelectric thin-film, and an external thin-film portion provided under the lower electrode and including at least one layer of a piezoelectric thin-film or a dielectric thin-film, the vibration unit being vibrated in an n-th harmonic (n is an integer of 2 or more), the upper electrode and the lower electrode being provided substantially in the positions of the loops of the n-th harmonic.

18 Claims, 8 Drawing Sheets

PIEZOELECTRIC RESONATOR, FILTER, AND ELECTRONIC COMMUNICATION DEVICE

This application is a Divisional of U.S. patent application Ser. No. 10/179,972 filed Jun. 26, 2002, now abandoned.

BACKGROUND OF THE INVENTION

1. Field of the Invention

The present invention relates to a piezoelectric resonator including a vibration unit having a multilayer structure including thin-films made of piezoelectric and dielectric materials, and more particularly, to a piezoelectric resonator which is used in a filter, an oscillator or other suitable apparatus and is operated so as to be thickness-longitudinally vibrated in a VHF band, a UHF band, and ultra-high frequency band of which the frequencies are higher than those of the these bands. Moreover, the present invention relates to a filter and an electronic communication device including the piezoelectric resonator.

2. Description of the Related Art

In some piezoelectric resonators using thickness-longitudinal vibration, a resonance response is achieved in an ultra-high frequency band by use of a structure in which a piezoelectric film with a very small film thickness is interposed between electrodes, utilizing an inversely proportional relationship between the resonance frequency and the thickness of the piezoelectric film.

Of the above-described piezoelectric resonators, some of the thickness-longitudinal vibration type are each provided with a substrate having a hole passing through the substrate from the front surface to the back surface, a diaphragm made of an $SiO_2$ thin film disposed on the substrate so as to cover the hole, and a vibration unit including a ZnO thin film interposed between a pair of opposed electrodes on the diaphragm.

Some of the above-described type piezoelectric resonators have a structure in which a piezoelectric film is sandwiched between a pair of upper and lower electrodes, and in particular, and have a structure in which the loops of a fundamental wave is positioned on the electrodes to eliminate the loss of resonance energy caused on the electrodes, so that the resonance characteristics are improved.

The loss of the resonance energy is reduced since the fundamental wave is used. However, in use of the fundamental wave, the resonance frequency temperature coefficient is considerably changed, due to the variation of the ratio of the thicknesses of the $SiO_2$ thin-film and the ZnO thin-film. Therefore, the resonance frequency tends to be significantly changed with the temperature. Thus, for the piezoelectric resonator, the stability of the resonance frequency to the change of temperature is low.

SUMMARY OF THE INVENTION

In order to overcome the problems described above, preferred embodiments of the present invention provide a piezoelectric resonator, a filter, and an electronic communication device, in which the loss of resonance energy on electrodes is greatly reduced, and the stability of resonance frequency to the change of temperature is significantly improved.

According to a preferred embodiment of the present invention, a piezoelectric resonator includes a substrate, a vibration unit disposed on the substrate and having a structure in which at least one pair of an upper electrode and a lower electrode are opposed to each other, the upper and lower electrodes sandwiching the upper and lower surfaces of an internal thin-film portion including at least one layer of a piezoelectric thin-film, and an external thin-film portion provided under the lower electrode and including at least one layer of a piezoelectric thin-film or a dielectric thin-film, the vibration unit being vibrated in an n-th harmonic (where n is an integer of 2 or higher), the upper electrode and the lower electrode being provided substantially in the positions of the loops of the n-th harmonic.

According to a preferred embodiment of the present invention, the upper electrode and the lower electrode are provided approximately in the positions of the loops. Thus, the resonance energy on the electrodes is greatly reduced. In addition, the vibration unit is vibrated in the vibration mode of an n-th harmonic. Thus, there is a film-thickness ratio range in which even if the film-thickness ratio of the thin-film portions is changed to be increased or decreased, the resonance frequency temperature coefficient is prevented from changing significantly. Therefore, the resonance frequency can be stabilized relative to the change of temperature by setting the film-thickness ratio to be in this range.

Preferably, the n-th harmonic is a second harmonic, and the film thickness ratio $r=t_o/t_i$ in which $t_o$ represents the thickness of the external thin-film, and $t_i$ represents the thickness of the internal thin-film is set at a value at which the resonance frequency temperature coefficient of the entire piezoelectric resonator is nearly zero.

In this case, since the n-th harmonic is a second harmonic, the resonance frequency can be more effectively stabilized relative to the change of temperature.

More preferably, the thin-film portion that is at least one of the internal thin-film portion and the external thin-film portion has a combination in which the respective thin-films have different resonance frequency temperature coefficients.

The combination includes any one of the combination of the respective thin-films constituting the internal thin-film portion if the internal thin-film portion includes a plurality of the thin-films, the combination of the respective thin-films constituting the external thin-film portion if the external thin-film portion includes a plurality of the thin-films, and the combination of the respective thin-films constituting the internal thin-film portion and the external thin-film portion, respectively.

Thereby, the resonance frequency temperature coefficient of the piezoelectric resonator can be more effectively set at zero. Thus, the resonance frequency can be more stabilized relative to the change of temperature.

More preferably, the external thin-film portion includes at least one of a thin-film having a $SiO_2$ thin-film as a major component, a thin-film including an SiN thin-film as a major component, and a thin-film including an $Al_2O_3$ thin-film as a major component.

More preferably, the internal thin-film portion includes a thin-film having ZnO as a major component, a thin-film including AlN as a major component, a thin-film including lead titanate zirconate (PZT) as a major component, a thin-film including lead titanate (PT) as a major component, and a thin-film including barium titanate (BT) as a major component.

More preferably, the substrate has a hole or a concavity, and the vibration unit is disposed above the hole or the concavity. Here, the hole indicates a space extending so as to pass through the substrate from the front surface to the back surface. The concavity indicates a space, which is a bottom depression formed in one surface of the substrate.

The resonance characteristic is greatly improved since the vibration unit is disposed above the hole or the concavity.

Thus, the piezoelectric resonator of which the resonance frequency temperature coefficient is small with respect to variations of a film thickness, that is, the change of the resonance frequency, caused by the change of temperature, is greatly reduced, and the resonance response to the change of temperature is very stable, can be provided.

Japanese Unexamined Patent Application Publication No. 2001-203558 discloses that the resonance frequency temperature coefficient of the entire piezoelectric resonator is nearly zero by using a structure in which a piezoelectric film having a negative resonance frequency temperature coefficient and a piezoelectric film having a positive resonance frequency temperature coefficient are sandwiched between a pair of upper and lower electrodes, and thereby, the resonance response to the change of temperature is stabilized.

EP0963040A2 discloses that the resonance energy loss on the electrodes is eliminated by using the structure in which a piezoelectric film is sandwiched between a pair of the upper and lower electrodes and adopting a configuration in which the loops of a resonance wave are positioned on the electrodes, so that the resonance characteristic is greatly improved.

Japanese Examined Patent Application Publication No. 1-48694 discloses that between a pair of piezoelectric films provided between a pair of upper and lower electrodes, a thin-film having a resonance frequency temperature coefficient with a sign different from that of the piezoelectric films is laminated in the center of the piezoelectric films, so that the temperature characteristic of the resonance frequency is greatly improved.

However, in such conventional devices, second harmonics are not used, and the loops of a vibration wave are not positioned on the opposite electrodes, in contrast to the present invention. Thus, the effects of the present invention cannot be achieved.

The filter in accordance with another preferred embodiment of the present invention includes a plurality of the piezoelectric resonators according to other preferred embodiments of the present invention, the electrodes in the piezoelectric resonators being connected to the configuration of a filter circuit.

The filter in accordance with another preferred embodiment of the present invention includes a plurality of the piezoelectric resonators according to other preferred embodiments of the present invention, which are connected in a ladder arrangement.

The duplexer in accordance with yet another preferred embodiment of the present invention is configured using the filter in accordance with the above-described preferred embodiments of the present invention.

The electronic communication device in accordance with a further preferred embodiment of the present invention includes at least one piezoelectric resonator according to the above-described preferred embodiments of the present invention, the piezoelectric resonator being used in electronic communication operation.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
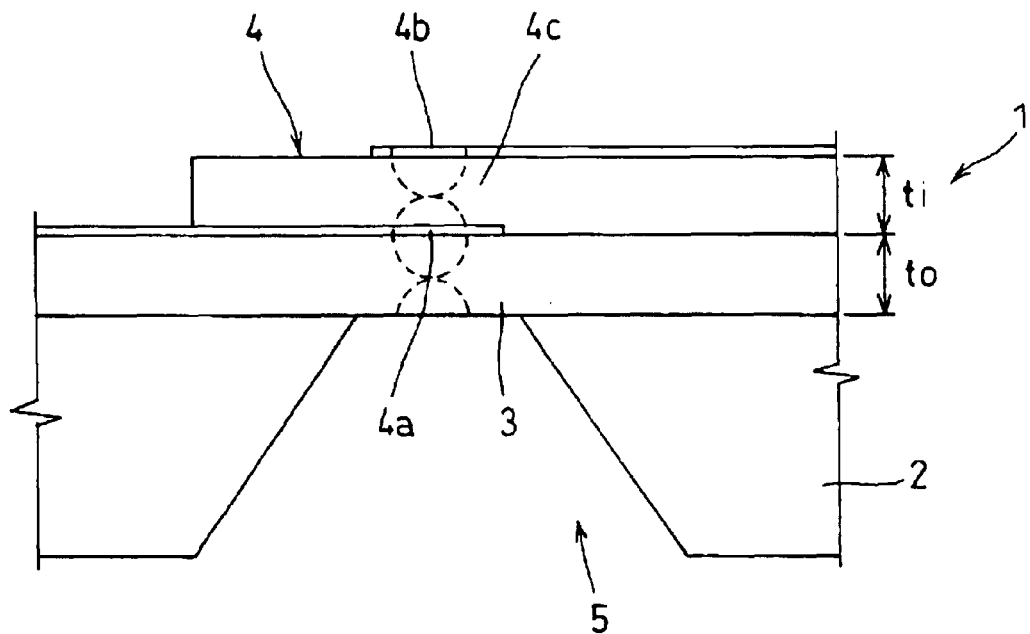
FIG. 1 is a cross-sectional view of a piezoelectric resonator according to a preferred embodiment of the present invention.

Hereinafter, preferred embodiments of the present invention will be described with reference to the drawings in detail.

The basic structure of a piezoelectric resonator of this preferred embodiment will be described with reference to FIG. 1.

Reference numeral 1 designates the entire portion of a resonator. The piezoelectric resonator 1 is preferably a thickness-longitudinal vibration type resonator, and preferably includes a substrate 2, a diaphragm 3, and a vibration unit 4.

The substrate 2 is preferably made of, e.g., Si (silicon) and has a hole 5 passing through the substrate 2 from the front surface to the back surface.

The diaphragm 3 functions as an external thin-film portion and is preferably made of a $SiO_2$ (silicon oxide) thin-film. The diaphragm 3 is arranged so as to cover the hole 5.

The vibration unit 4 is provided on the diaphragm 3, and includes a pair of upper and lower opposed electrodes which define an upper electrode 4b and a lower electrode 4a, and an internal thin-film portion 4c having one or more layers. The internal thin-film portion 4c includes at least a piezoelectric film that is interposed between the upper electrode 4b and the lower electrode 4a.

Both of the opposed electrodes 4a and 4b are preferably made of, e.g., Al (aluminum).

The internal thin-film portion 4c is preferably made of, e.g., a ZnO (zinc oxide) thin-film.

A production example of the piezoelectric resonator having the above-described structure will be briefly described. Both surfaces of the substrate 2 are heat-oxidized to form heat-oxidized $SiO_2$ thin-films. The heat-oxidized $SiO_2$ thin-film on the front surface of the substrate 2 constitutes the diaphragm 3. The heat-oxidized $SiO_2$ thin-film on the back surface of the substrate 2 is patterned correspondingly to the hole 5 by photolithography. Thereby, the back surface of the substrate 2 is exposed. The exposed back surface of the substrate 2 is anisotropically etched using an alkali solution. This etching reaches the $SiO_2$ thin-film on the front surface of the substrate 2, whereby a hole 5 is formed in the substrate 2. Subsequently, the lower electrode 4a is formed on the diaphragm 3 of the $SiO_2$ thin-film on the surface of the substrate 2, preferably by lift-off vapor deposition. Thereafter, the internal thin-film portion 4c including a ZnO thin-film is formed on the lower electrode 4a and the diaphragm 3 by sputtering or another film-forming technique. Subsequently, the upper electrode 4b is formed on the internal thin-film portion 4c by lift-off vapor deposition.

Thus, the production of the piezoelectric resonator 1 is completed.

In this preferred embodiment, according to the above-described structure, the piezoelectric resonator 1 is vibrated in the second harmonic vibration mode of which the fundamental wave is illustrated by the broken line in FIG. 1. Moreover, the upper electrode 4b and the lower electrode 4a are disposed substantially in the positions of the loops of the second harmonic. The nodes of the second harmonic exist in the internal and external thin-film portions 3 and 4c.

Thus, since the loops of the second harmonic are positioned in the upper electrode 4b and the lower electrode 4a, the loss of resonance energy on the lower electrode 4a and the upper electrode 4b is greatly reduced, and thus, the resonance characteristic is significantly improved.

In addition, in this preferred embodiment, the diaphragm 3 and the respective thin-films of the vibration unit 4 are combined in such a manner that the resonance frequency temperature coefficients thereof have different signs. Moreover, the thickness ratio $r=t_o/t_i$ in which $t_o$ represents the thickness of the $SiO_2$ thin-film as the diaphragm 3, and $t_i$ represents the thickness of the ZnO thin-film of the vibration unit 4 is preferably set at a value at which the resonance frequency temperature coefficient of the entire piezoelectric resonator 1 becomes nearly zero.

The thickness ratio r will be further described with reference to FIG. 2.

Figure 2:
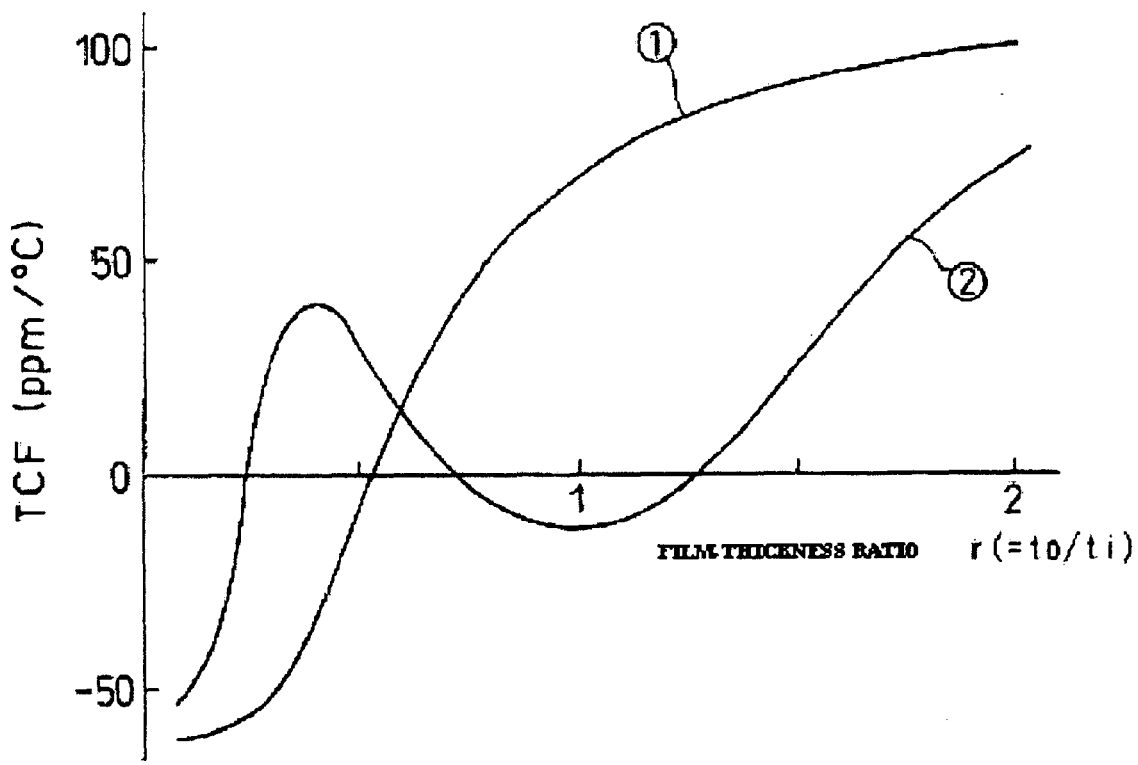
FIG. 2 is a graph showing the relationship between the film-thickness ratio and the resonance frequency temperature coefficient of the piezoelectric resonator of FIG. 1.

In FIG. 2, the film-thickness ratio r is plotted as abscissa, and the resonance frequency temperature coefficient TCF as the ordinate. Reference numerals (1) and (2) represent a fundamental wave and the second harmonic. The thicknesses of the respective thin-films are designed in such a manner that the vibration unit 4 of this preferred embodiment is excited in the thickness-longitudinal resonance mode of the twice harmonic. The film-thickness ratio r is preferably in the range of about 0.6 to about 1.3.

When the film-thickness ratio r is in this preferred range, the resonance frequency temperature coefficient TCF is about +10 ppm/° C. to about −10 ppm/° C. Thus, the resonance frequency temperature coefficient TCF can be set nearly at zero by setting the film-thickness ratio r to be in the above-described range. Thereby, the vibration frequency of the piezoelectric resonator 1 can be stabilized relative to the change of temperature.

As described above, the resonance frequency temperature coefficient can be set nearly at zero by adjustment of the film-thickness ratio r. This is due to the external thin-film portion 3 made of the $SiO_2$ thin-film having a positive resonance frequency temperature coefficient and the internal thin-film portion 4c made of the ZnO thin-film having a negative resonance frequency temperature coefficient. Referring to FIG. 2, when the film-thickness ratio $t_o$ of the external thin-film portion 3 having a positive resonance frequency temperature coefficient is increased from a value of 1, relatively to the internal thin-film portion 4c having a negative resonance frequency temperature coefficient, so that the film-thickness ratio r becomes more than 1, the resonance frequency temperature coefficient TCF gradually approaches zero until the film-thickness ratio r becomes about 1.3. Moreover, when the film-thickness ratio $t_o$ of the external thin-film portion 3 is further increased to be about 1.3 or more, the resonance frequency temperature coefficient TCF is further increased from zero. On the other hand, when the film-thickness $t_o$ of the external thin-film portion 3 is decreased so that the film-thickness ratio r is reduced, the resonance frequency temperature coefficient TCF gradually approaches zero until the film-thickness ratio r is reduced to about 0.6. When the film-thickness $t_o$ of the external thin-film portion 3 is further decreased to be about 0.6 or smaller, the resonance frequency temperature coefficient TCF is further increased from zero.

As described above, the resonance frequency of the piezoelectric resonator 1 can be stabilized relative to the change of temperature by adjustment of the resonance frequency temperature coefficient TCF to substantially zero which is carried out by setting of the film-thickness ratio r.

The present invention is not limited to the above-described preferred embodiments. Various applications and modifications cam be carried out without departing from the spirit and the scope of the present invention.

In any of the following preferred embodiments, it is premised that a second harmonic is used, and the loops of the second harmonic are positioned substantially on the upper electrode 4b and the lower electrode 4a. Accordingly, the range shown in FIG. 2 in which the change of the resonance frequency with temperature is small can be used by adjustment of the film-thickness ratio of the external thin-film portion 3 and the internal thin-film portion 4c.

(1) The preferred embodiment shown in FIG. 1 preferably uses a second harmonic. However, this is not restrictive. The vibration unit may be vibrated in the vibration mode of an N-th harmonic (n is an integer of 2 or greater), and the upper electrode 4b and the lower electrode 4a may be provided in the positions of the loops of the n-th harmonic.

Figure 3:
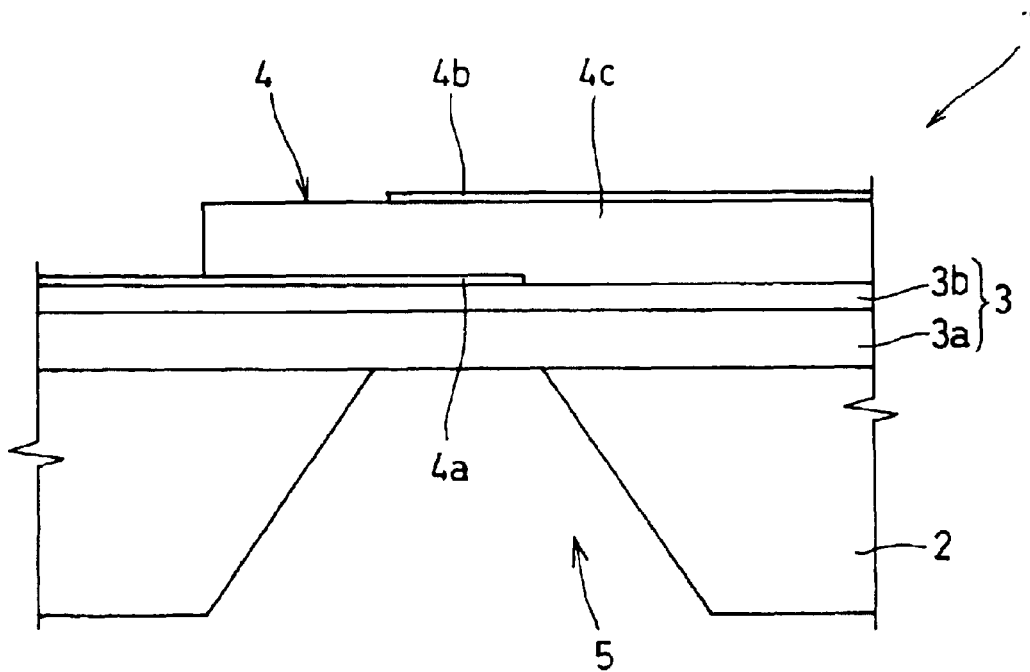
FIG. 3 is a cross-sectional view of a piezoelectric resonator according to another preferred embodiment of the present invention.

(2) As shown in FIG. 3, the external thin-film portion 3 may have a two layer structure which includes a heat oxidized $SiO_2$ film 3a and an SiN (silicon nitride) film 3b.

This external thin-film portion 3 includes two layers having different resonance frequency temperature coefficients, that is, the films 3a and 3b. Therefore, the resonance frequency temperature coefficient of the entire external thin-film portion 3 can be adjusted by appropriately changing the film-thickness ratio of the films 3a and 3b. By this adjustment, the temperature-dependent change-ratio of the resonance frequency temperature coefficient of the entire piezoelectric resonator 1 is significantly reduced. Thus, the stability to the change of temperature is greatly improved.

Figure 4:
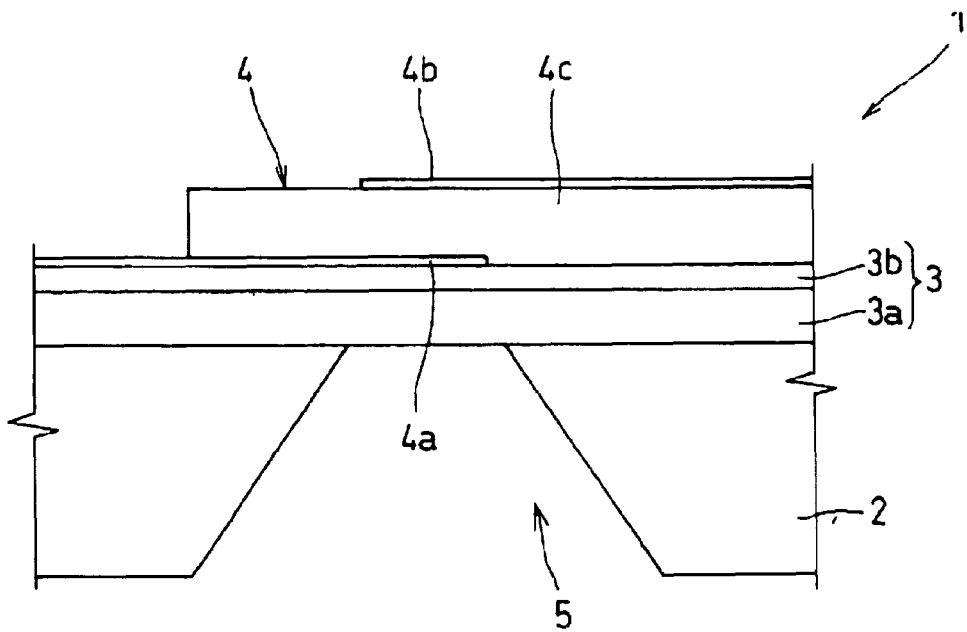
FIG. 4 is a cross-sectional view of a piezoelectric resonator according to still another preferred embodiment of the present invention.

(3) As shown in FIG. 4, the external thin-film portion 3 may have two layer structure which includes a heat oxidized $SiO_2$ film 3c and an $SiO_2$ film 3d preferably formed by sputtering.

According to this structure of the external thin-film portion 3, the temperature characteristic of the resonance frequency of the internal thin-film portion 4c can be compensated by adjustment of the temperature characteristic of the resonance frequency of the entire portions of both of the films 3c and 3d constituting the external thin-film portion 3.

Figure 5:
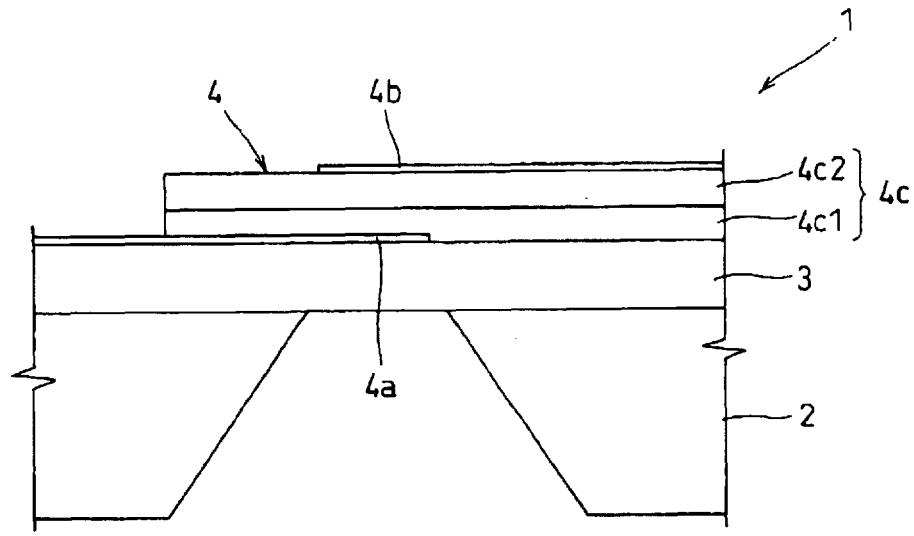
FIG. 5 is a cross-sectional view of a piezoelectric resonator according to yet another preferred embodiment of the present invention.

(4) As shown in FIG. 5, the internal thin-film portion 4c may have a two layer structure including an AlN (aluminum nitride) film 4c1 and an ZnO film 4c2.

In this structure of the internal thin-film portion 4c, the AlN film 4c1 has a positive resonance frequency temperature coefficient, while the ZnO film 4c2 has a negative resonance frequency temperature coefficient. Therefore, the internal thin-film portion 4c can be produced in such a manner that the resonance frequency temperature coefficient of the entire piezoelectric resonator 1 approaches zero by compensating for the resonance frequency temperature coefficient of the external thin-film portion 3 made of the heat oxidized $SiO_2$ utilizing the two layer structure including the AlN film 4c1 and the ZnO film 4c2. As a result, the resonance frequency temperature coefficient of the piezoelectric resonator 1 is greatly reduced, so that the temperature characteristic becomes stable.

Figure 6:
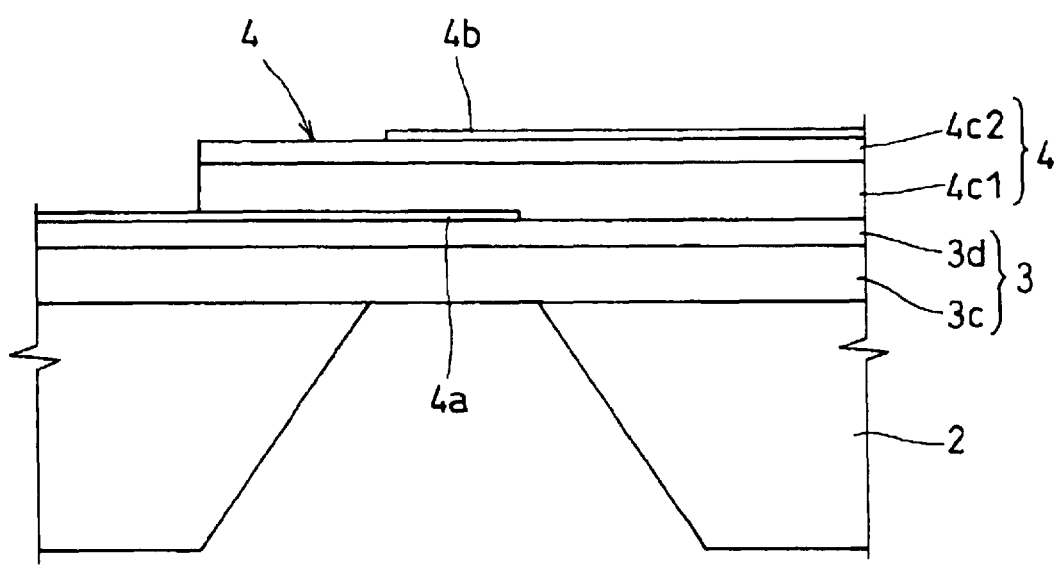
FIG. 6 is a cross-sectional view of a piezoelectric resonator according to another preferred embodiment of the present invention.

(5) As shown in FIG. 6, the external thin-film portion 3 may have the two layer structure including the heat oxidized $SiO_2$ film 3c and the $SiO_2$ film 3d preferably formed by sputtering, and also, the internal thin-film portion 4c may have the two-layer structure including the AlN film 4c1 and the ZnO film 4c2. Thereby, the same operation and effects as described above can be attained.

Figure 7:
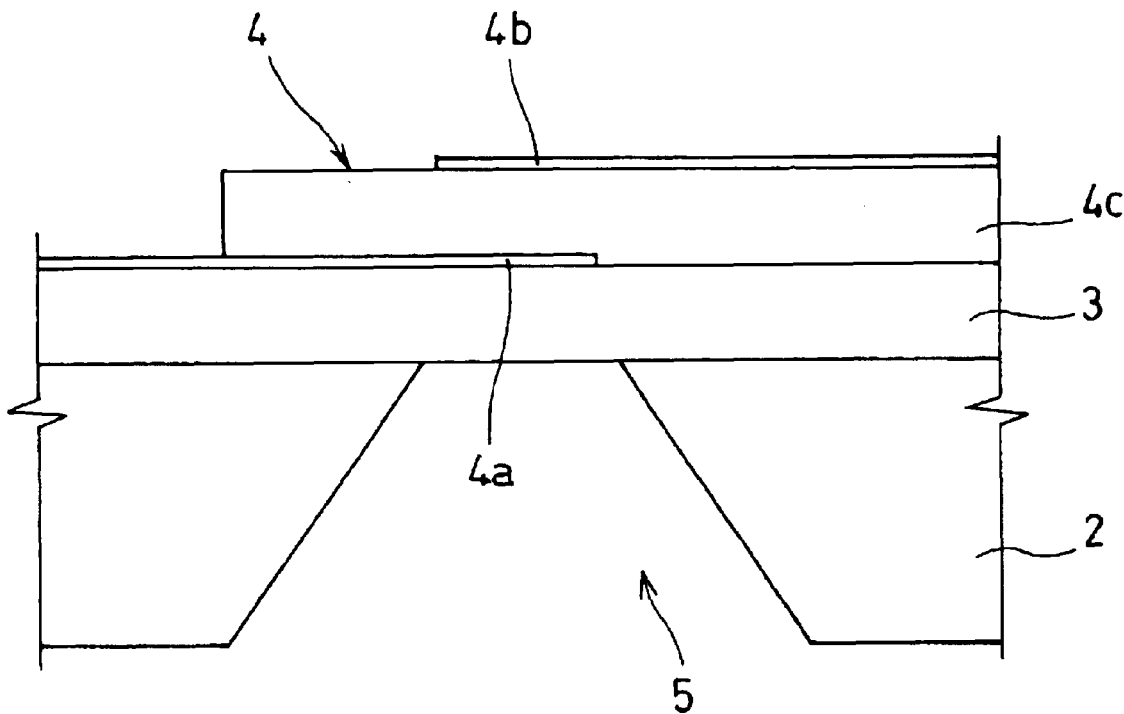
FIG. 7 is a cross-sectional view of a piezoelectric resonator according to still another preferred embodiment of the present invention.

(6) As shown in FIG. 7, the external thin-film portion 3 may include an SiN film, and the internal thin-film portion 4c may include an AlN film. In this case, the same operation and effects as described in the Items (3) and (4) above can be attained at the same time.

Figure 8:
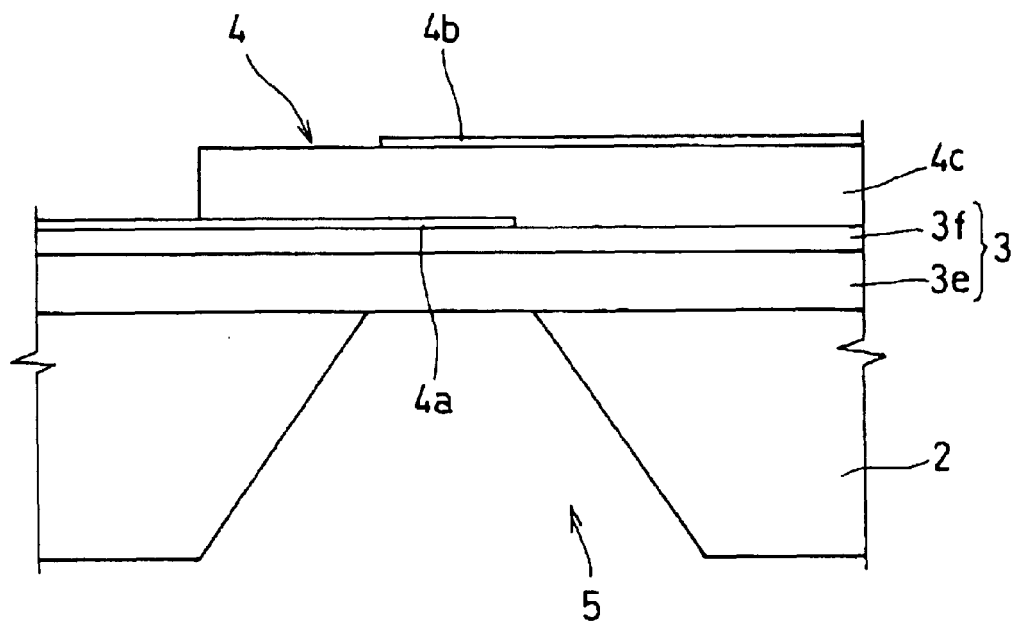
FIG. 8 is a cross-sectional view of a piezoelectric resonator according to yet another preferred embodiment of the present invention.

(7) As shown in FIG. 8, the external thin-film portion 3 may have a two-layer structure including an AlN film 3e and an $Al_2O_3$ (aluminum oxide) film 3f, and also, the internal thin-film portion 4c may have an AlN single layer structure. Also, in this case, the same operation and effects as described in Items (3) and (4) above can be attained at the same time.

(8) The internal thin-film portion 4c of the vibration unit may include at least one of a thin-film containing PZT (lead titanate zirconate) as a major component, a thin-film including PT (lead titanate) as a major component, and a thin-film containing BT (barium titanate) as a major component, in addition to the thin-film containing ZnO as a major component and the thin-film containing AlN as a major component.

Figure 9A:
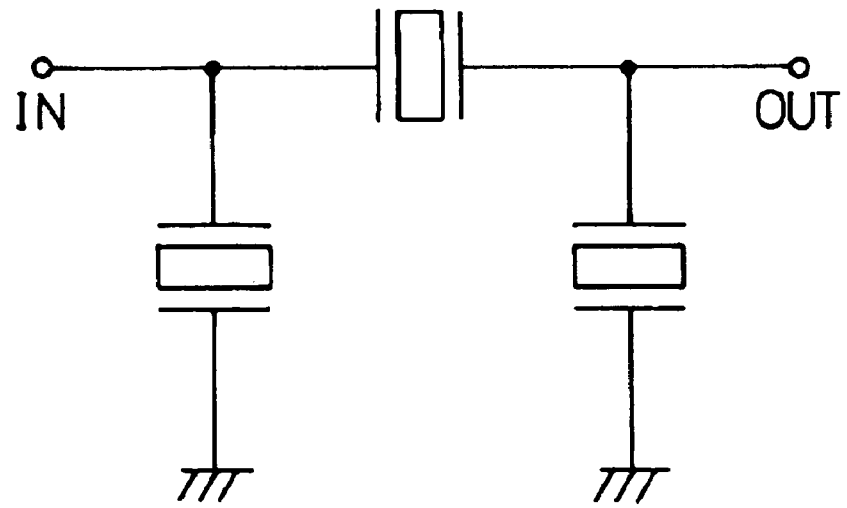
FIGS. 9A, 9B, and 9c are circuit diagrams each showing a filter in which the piezoelectric resonator according to preferred embodiments of the present invention is used.
Figure 9B:
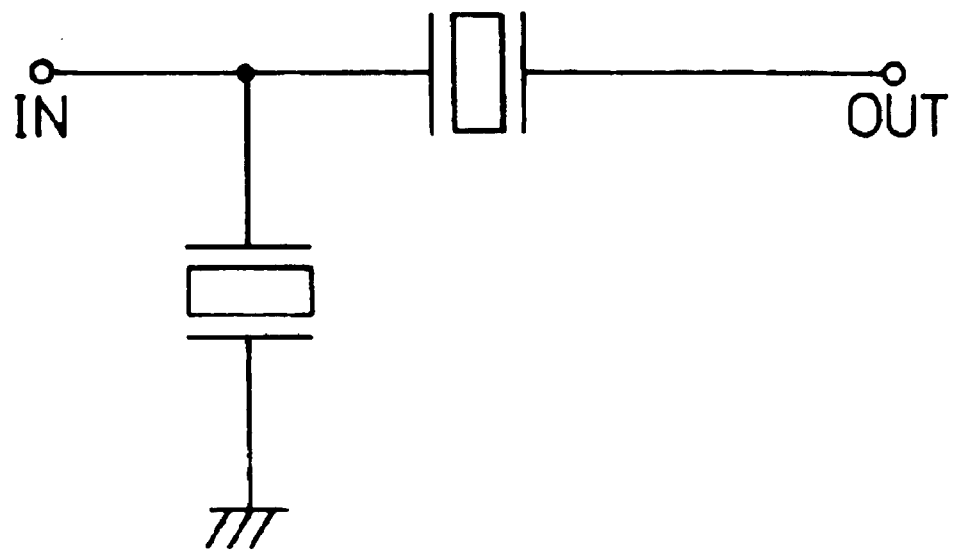
Figure 9C:
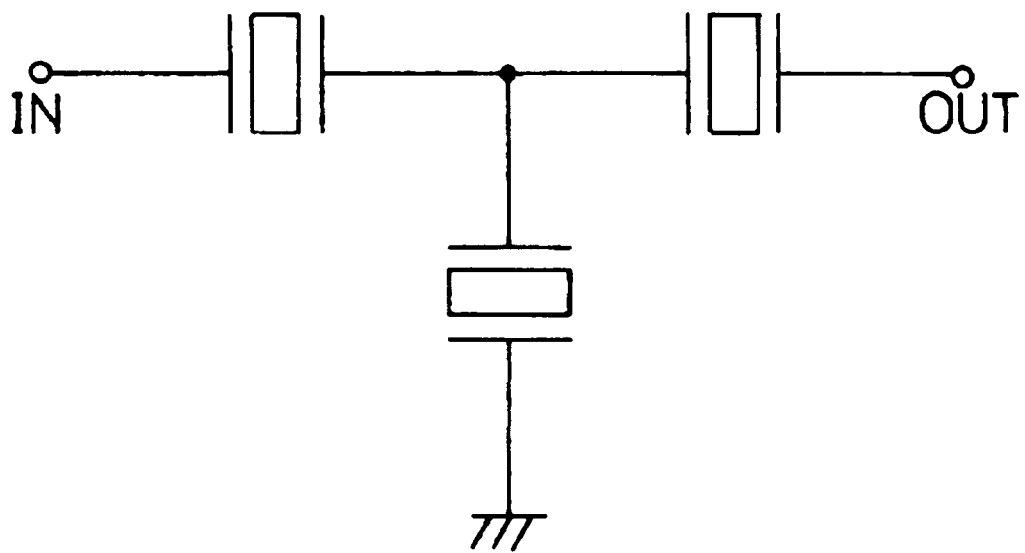
Figure 10A:
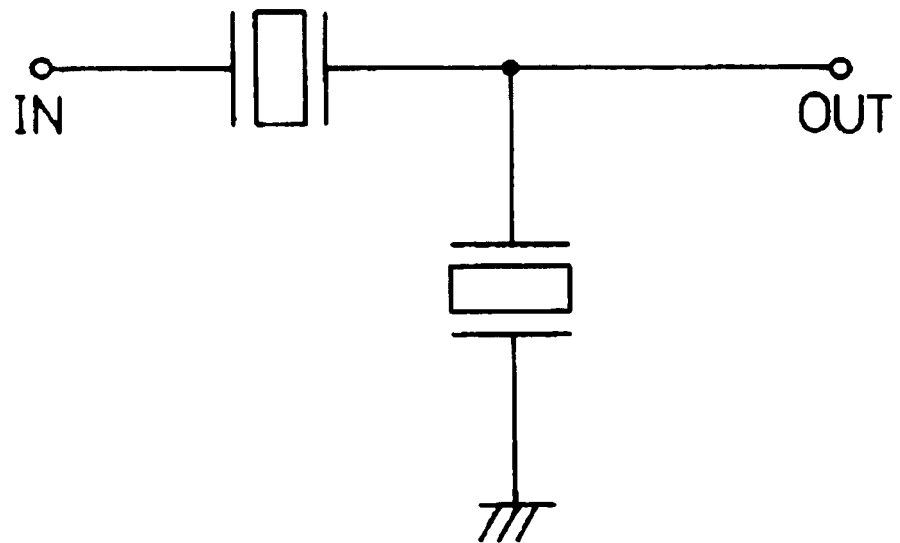
FIGS. 10A and 10B are circuit diagrams each showing a filter in which the piezoelectric resonator according to preferred embodiments of the present invention is used.
Figure 10B:
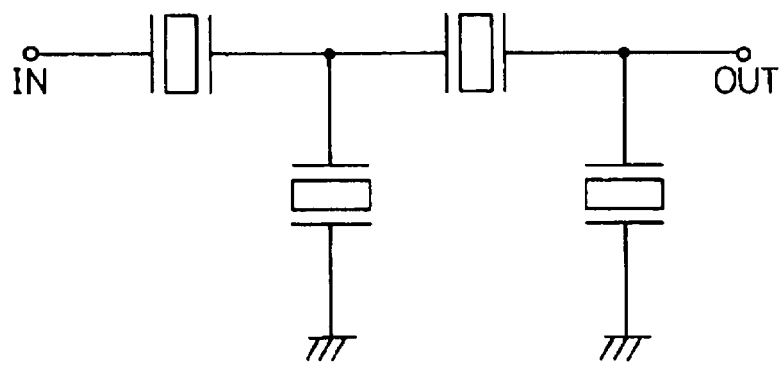

(9) The piezoelectric resonator 1 of this preferred embodiment may be incorporated as a filter element into a π type ladder filter shown in FIG. 9A, an L type ladder filter shown in FIG. 9B, a T type ladder filter shown in FIG. 9C, an L type ladder filter shown in FIG. 10A, and an L type ladder filter shown in FIG. 10B. These filters have filter characteristics that are stable relative to the change of temperature. For the respective filters, a plurality of the above-described piezoelectric resonators 1 are provided on the substrate 2. The piezoelectric resonators 1 on the substrate 2 can be connected via the respective electrodes thereof to provide a filter of which the operational characteristic is stabilized relative to the environmental temperature change.

(10) The piezoelectric resonator of this preferred embodiment may be mounted in a portable telephone, a radio-wave LAN, and other different kinds of communication devices. Thus, when the piezoelectric resonator is used in electronic communication operation of these electronic communication devices, the operational characteristic can be stabilized with respect to the environmental temperature-change.

Figure 11:
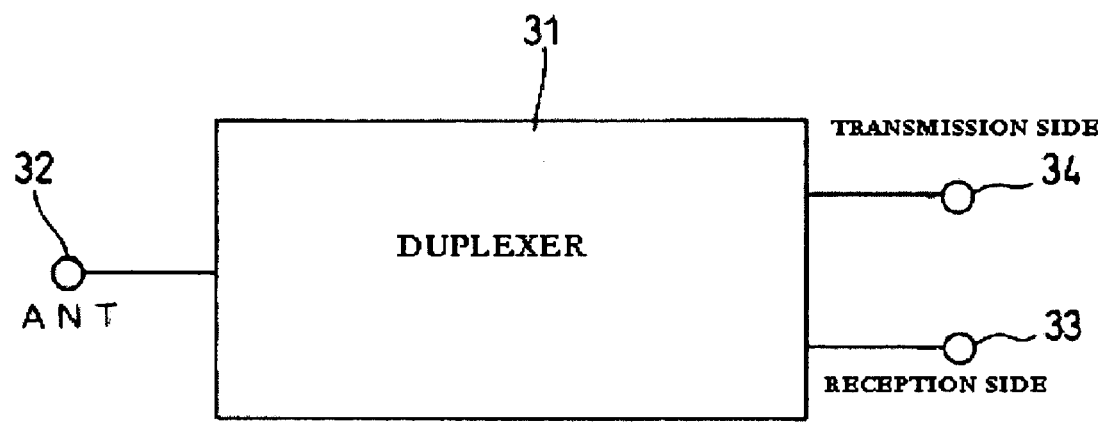
FIG. 11 is a schematic illustration of a duplexer using the piezoelectric resonator according to preferred embodiments of the present invention.

(11) The piezoelectric resonator 1 of this preferred embodiment may be used as an element for a duplexer to be mounted onto a communication device. A duplexer 31 is provided with an antenna-terminal 32, a reception side terminal 33, and a transmission side terminal 34 as shown in FIG. 11. The duplexer 31 is configured to include the piezoelectric resonator of preferred embodiments of the present invention or the filter described in Item 9 between the reception side terminal 33, the transmission side terminal 34 and the antenna terminal 32 which permits a high frequency signal in a required frequency band to be transmitted.

Figure 12:
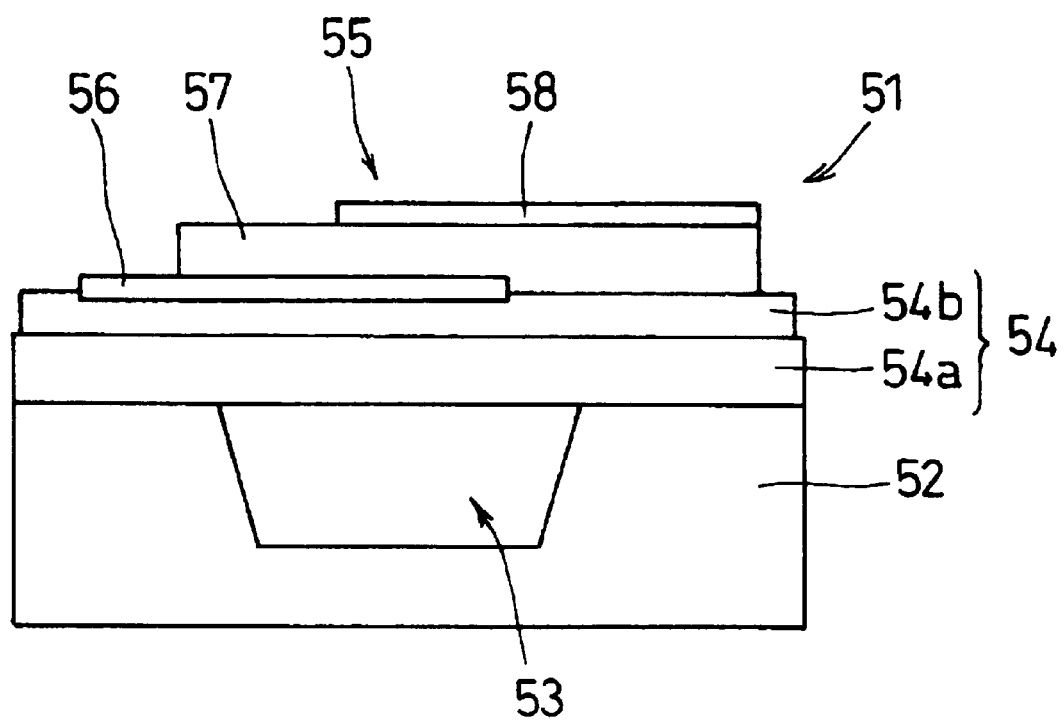
FIG. 12 is a cross-sectional view of a piezoelectric resonator according to another preferred embodiment of the present invention.

(12) The structure shown in FIG. 12 may be used as a modification of the piezoelectric resonator of other preferred embodiments of the present invention. In a piezoelectric resonator 51 shown in FIG. 12, a concavity 53 is formed on the upper surface of a silicon substrate 52. A diaphragm 54 as the external thin-film potion, preferably including two layers, that is, a heat-oxidized $SiO_2$ film 54a and an SiN film (silicon nitride) 54b, is arranged so as to cover the upper surface of the silicon substrate 52 and the concavity 53. A vibration unit 55 is arranged on the diaphragm 54. The vibration unit 55 includes a pair of upper and lower opposed-electrodes, that is, an upper electrode 58 and a lower electrode 56, and an internal thin-film portion 57 including at least one layer of a piezoelectric film sandwiched between the upper electrode 58 and the lower electrode 56.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric resonator comprising:
   a substrate;
   a vibration unit disposed on the substrate and having a structure in which at least one pair of an upper electrode and a lower electrode are opposed to each other, the upper and lower electrodes sandwiching the upper and lower surfaces of an internal thin-film portion including at least one layer of a piezoelectric thin-film; and
   an external thin-film portion provided under the lower electrode and including at least one layer of one of a piezoelectric thin-film and a dielectric thin-film; wherein
   the vibration unit is vibrated in an n-th harmonic, where n is an integer of 2 or greater, the upper electrode and the lower electrode are located substantially in the positions of the loops of the n-th harmonic; wherein
   the external thin-film portion includes an $SiO_2$ thin-film as a major component;
   the internal thin-film portion includes AlN as a major component; and
   nodes of the n-th harmonic exist in the internal and external thin-film portions.

2. A piezoelectric resonator according to claim 1, wherein the n-th harmonic is a second order harmonic.

3. A piezoelectric resonator according to claim 2, wherein the film thickness ratio $r=t_o/t_i$ in which $t_o$ represents the thickness of the external thin-film, and $t_i$ represents the thickness of the internal thin-film is set at a value at which the resonance frequency temperature coefficient of the entire piezoelectric resonator is nearly zero.

4. A piezoelectric resonator according to claim 3, wherein the film-thickness ratio r is preferably in the range of about 0.6 to about 1.3.

5. A piezoelectric resonator according to claim 1, wherein the substrate has a hole that passes through a top surface to a bottom surface of the substrate and the vibration unit is disposed above the hole.

6. A piezoelectric resonator according to claim 5, further comprising a diaphragm that is arranged to cover the hole.

7. A filter including a plurality of the piezoelectric resonators according to claim 1 and a filter circuit, wherein the electrodes of the piezoelectric resonators are connected to the filter circuit.

8. A duplexer including the filter according to claim 7.

9. A filter including a plurality of the piezoelectric resonators according to claim 1, wherein the piezoelectric resonators are connected in a ladder arrangement.

10. A duplexer including the filter according to claim 9.

11. A piezoelectric resonator according to claim 1, wherein the n-th harmonic is a second order harmonic, and the film thickness ratio $r=t_o/t_i$ in which $t_o$ represents the thickness of the external thin-film, and $t_i$ represents the thickness of the internal thin-film is set at a value at which the resonance frequency temperature coefficient of the entire piezoelectric resonator is nearly zero.

12. A piezoelectric resonator according to claim 1, wherein the respective thin-films of at least one of the internal thin-film portion and the external thin-film portion are combined in such a manner as to have different resonance frequency temperature coefficients.

13. A piezoelectric resonator according to claim 1, wherein the substrate has one of a hole and a concavity, and the vibration unit is disposed above the one of the hole and the concavity.

14. A piezoelectric resonator according to claim 1, wherein the piezoelectric resonator is a thickness-longitudinal vibration type resonator.

15. A piezoelectric resonator according to claim 1, wherein the opposed electrodes are made of aluminum.

16. A piezoelectric resonator according to claim 1, wherein the resonance frequency temperature coefficient TCF is about +10 ppm/° C. to about −10 ppm/° C.

17. A piezoelectric resonator according to claim 1, wherein the external thin-film portion includes two layers having different resonance frequency temperature coefficients.

18. An electronic communication device including at least one piezoelectric resonator according to claim 1.

* * * * *